(12) United States Patent
Xu

(10) Patent No.: US 9,919,918 B2
(45) Date of Patent: Mar. 20, 2018

(54) WAFER-LEVEL BONDING PACKAGING METHOD AND WAFER STRUCTURE

(71) Applicants: Semiconductor Manufacturing International (Beijing) Corporation, Beijing (CN); Semiconductor Manufacturing International (Shanghai) Corporation, Shanghai (CN)

(72) Inventor: Wei Xu, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

(*) Notice: Subject to any disclaimer, the term of this patent is extended or adjusted under 35 U.S.C. 154(b) by 0 days.

(21) Appl. No.: 15/214,108

(22) Filed: Jul. 19, 2016

(65) Prior Publication Data
US 2017/0022053 A1 Jan. 26, 2017

(30) Foreign Application Priority Data
Jul. 20, 2015 (CN) .......................... 2015 1 0428072

(51) Int. Cl.
*B81C 1/00* (2006.01)
*B81B 7/00* (2006.01)

(52) U.S. Cl.
CPC .......... *B81C 1/00238* (2013.01); *B81B 7/007* (2013.01); *B81C 2203/037* (2013.01); *B81C 2203/0792* (2013.01)

(58) Field of Classification Search
CPC .................................................. B81C 1/00238
See application file for complete search history.

(56) References Cited

U.S. PATENT DOCUMENTS

| 8,716,852 B2* | 5/2014 | Shu | ........................ B81B 7/0038 257/254 |
| 2014/0339710 A1* | 11/2014 | Fujiwara | ................. H01L 23/02 257/783 |
| 2015/0210537 A1* | 7/2015 | Chang | ................... B81B 3/0051 257/704 |

* cited by examiner

*Primary Examiner* — Marc Armand
(74) *Attorney, Agent, or Firm* — Anova Law Group, PLLC

(57) ABSTRACT

The present disclosure provides a wafer-level bonding packaging method, including: providing a plurality of first wafers and a plurality of second wafers, a to-be-bonded surface of a first wafer being a first to-be-bonded surface, a to-be-bonded surface of a second wafer being a second to-be-bonded surface, and the first to-be-bonded surface including a first region and a second region; forming at least one first bonding structure on the second region; forming at least one second bonding structure on a second to-be-bonded surface, the at least one second bonding structure corresponding to the at least one first bonding structure; and forming a supporting layer on the first region, a height of supporting layer being greater than a height of the first bonding structure and less than a sum of the height of the first bonding structure and a height of the second bonding structure.

20 Claims, 6 Drawing Sheets

WAFER-LEVEL BONDING PACKAGING METHOD AND WAFER STRUCTURE

CROSS-REFERENCES TO RELATED APPLICATIONS

This application claims the priority of Chinese Patent Application No. 201510428072.0 filed on Jul. 20, 2015, the entire content of which is incorporated herein by reference.

FIELD OF THE DISCLOSURE

The present disclosure generally relates to the field of semiconductor technology, more particularly, relates to a wafer-level bonding packaging method and a wafer structure.

BACKGROUND

In semiconductor manufacturing, conventional wafer packaging methods often utilize wire bonding for the packaging of the wafers. As the development of very-large-scale integration (VLSI), integrated circuits gradually become miniaturized. Wire bonding is not able to meet the requirements of manufacturing. Thus, wafer-level bonding packaging gradually replaces wire bonding packaging and has become an important packaging method.

For example, in the fabrication of micro electro mechanical system (MEMS) devices, eutectic bonding materials are often used for eutectic bonding between wafers. Further, back sides of the bonded wafers are thinned. Al or Cu rewiring and ball drop are further implemented to form a wafer-level bonding packaged structure.

FIG. 1 illustrates a wafer structure formed by a conventional eutectic bonding process. One wafer is an application specific integrated circuit (ASIC) wafer, and the other wafer is a MEMS wafer.

As shown in FIG. 1, in the conventional eutectic bonding process between an ASIC wafer and an MEMS wafer, an Al film 110 is often deposited on a surface of the ASIC wafer 100, where the surface is referred as a to-be-bonded surface. A Ge film 130 is often deposited on a surface of the MEMS wafer 120, where the surface is referred as another to-be-bonded surface. Further, the ASIC wafer 100 is placed on a first hot plate 140, and the MEMS wafer 120 is placed on a second hot plate 150. The to-be-bonded surface of the ASIC wafer 100 is often aligned with the to-be-bonded surface of the MEMS wafer 120.

The first hot plate 140 and the second hot plate 150 are used to heat up the ASIC wafer 100 and the MEMS wafer 120 and to create pressing force between the Al film 110 and the Ge film 130. Thus, the Al film 110 and the Ge film 130 melt and mix/alloy together because of the heating and the pressing force. A eutectic bonding layer may be formed between the ASIC wafer 100 and the MEMS wafer 120. Thus, the ASIC wafer 100 and the MEMS wafer 120 are bonded together.

However, in the conventional eutectic bonding process, short circuits often occur in or between the wafers. The fabrication yield of the wafer bonding process is impaired. The disclosed wafer-level bonding packaging method and a wafer structure are directed to solve one or more problems set forth above and other problems.

BRIEF SUMMARY OF THE DISCLOSURE

The present disclosure provides a wafer-level bonding packaging method and a wafer structure formed by the disclosed method. The yield of the wafer bonding process may be improved.

One aspect of the present disclosure provides a wafer-level bonding packaging method, including: providing a plurality of first wafers and a plurality of second wafers, a to-be-bonded surface of a first wafer being a first to-be-bonded surface, a to-be-bonded surface of a second wafer being a second to-be-bonded surface, and the first to-be-bonded surface including a first region and a second region; forming at least one first bonding structure on the second region; forming at least one second bonding structure on a second to-be-bonded surface, the at least one second bonding structure corresponding to the at least one first bonding structure; forming a supporting layer on the first region, a height of supporting layer being greater than a height of the first bonding structure and less than a sum of the height of the first bonding structure and a height of the second bonding structure; and aligning at least one first bonding structure with at least one second bonding structure to facilitate eutectic bonding between at least one first wafer and at least one second wafer.

Another aspect of the present disclosure provides a wafer structure formed by eutectic bonding, including a plurality of first wafers, a plurality of second wafers, at least one supporting layer, a plurality of first bonding structures, and a plurality of second bonding structures. A first wafer has at least one first to-be-bonded surface for forming eutectic bonding, a first to-be-bonded surface including a first region and a second region, and at least one first bonding structures being formed on the second region. A second wafer has at least one second to-be-bonded surface for forming eutectic bonding, at least one second bonding structures being formed a the second to-be-bonded surface, a second bonding structure corresponding to a first bonding structure and forming eutectic bonding with the first bonding structure. A supporting layer is disposed on the first region of a first to-be-bonded surface between a first wafer and a second wafer, one surface of the supporting layer contacting the first to-be-bonded surface and another surface of the supporting layer contacting a second to-be-bonded surface.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention.

In a eutectic bonding process, two types of metal materials are often mixed to form an alloy and solidified. The metal materials frequently used for eutectic bonding processes include alloy materials such as AuSi, AuSn, AuGe, CuSn, and AlGe. In a eutectic bonding process, metal layers or eutectic bonding layers formed on the to-be-bonded surfaces of the wafers mix or alloy under a eutectic temperature. Conventional eutectic bonding processes are often susceptible to short circuits in and/or between the wafers. As a result, the eutectic bonding process may have an impaired yield. The reasons for the short circuits may include that, the metal materials used for eutectic bonding layers melt to a liquid state during the eutectic bonding process. Once being pressed, the formed metal alloy may overflow outward and affect the contacts in the wafers and/or between the wafers. Short circuits may be formed.

To solve the technical issues described above, the present disclosure provides an improved or optimized eutectic bonding method. Specifically, a supporting material layer is formed on the first to-be-bonded surface and the first bonding structure. The supporting material layer is etched. The portion of the supporting material layer on the first region of the first to-be-bonded surface is retained to form a supporting layer. When the first wafer and the second wafer are being bonded together through a eutectic bonding process, the pressing force generated by the eutectic bonding process is cancelled out or neutralized in the supporting layer such that the eutectic bonding materials between the first wafer and the second wafer would not overflow outward due to excessive pressing force. Short circuits in and/or between the wafers can be avoided or reduced. In addition, in the process to etch the supporting material layer, the portions of the supporting material layer on the two sides of a first bonding structure are retained to form a side supporting layer or a shoulder supporting layer. The shoulder supporting layer also neutralizes some of the pressing force, protects the eutectic bonding materials, and prevents the eutectic bonding materials from overflowing outward.

Figure 7:
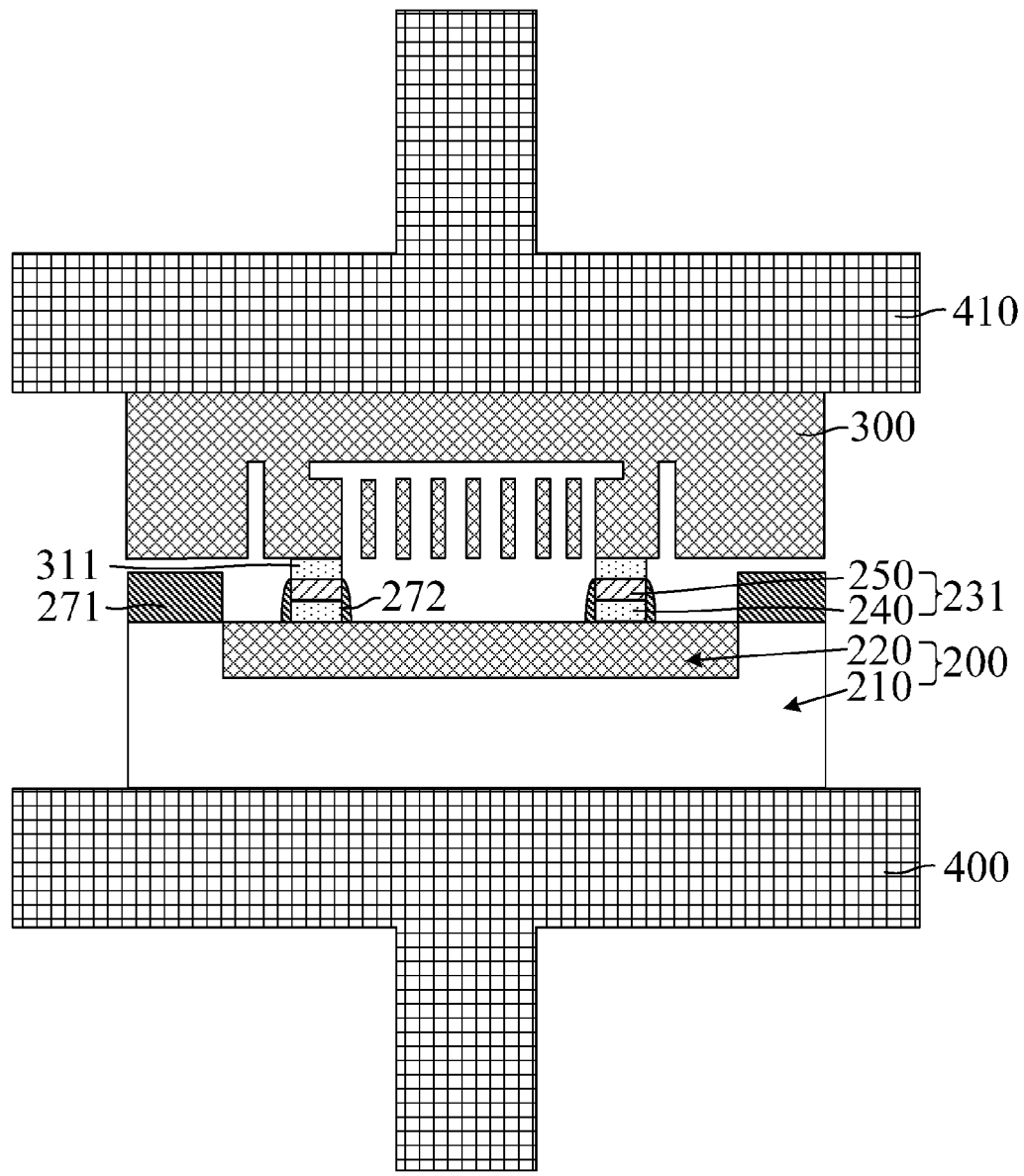
Figure 8:
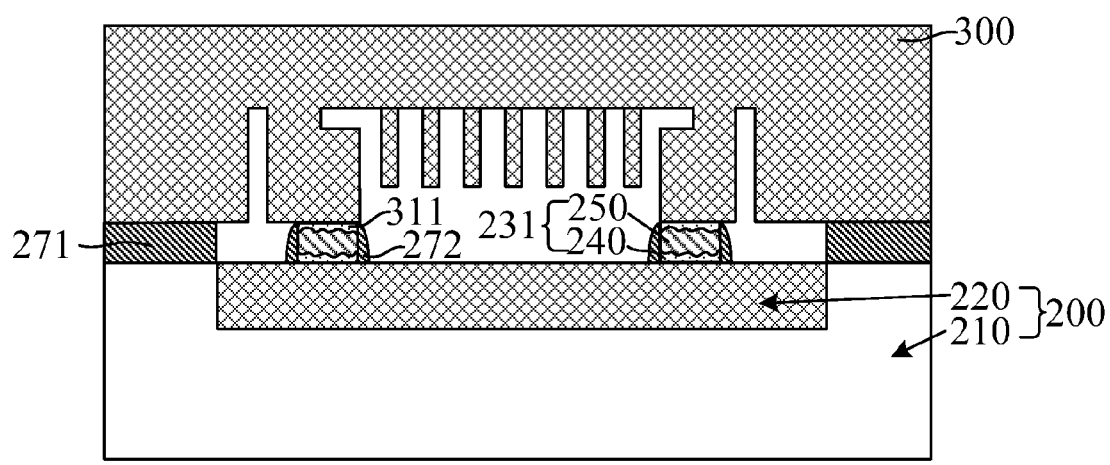
FIG. 8 illustrates an exemplary structure of a wafer structure formed by an exemplary eutectic bonding process consistent with various disclosed embodiments of the present disclosure.
Figure 9:
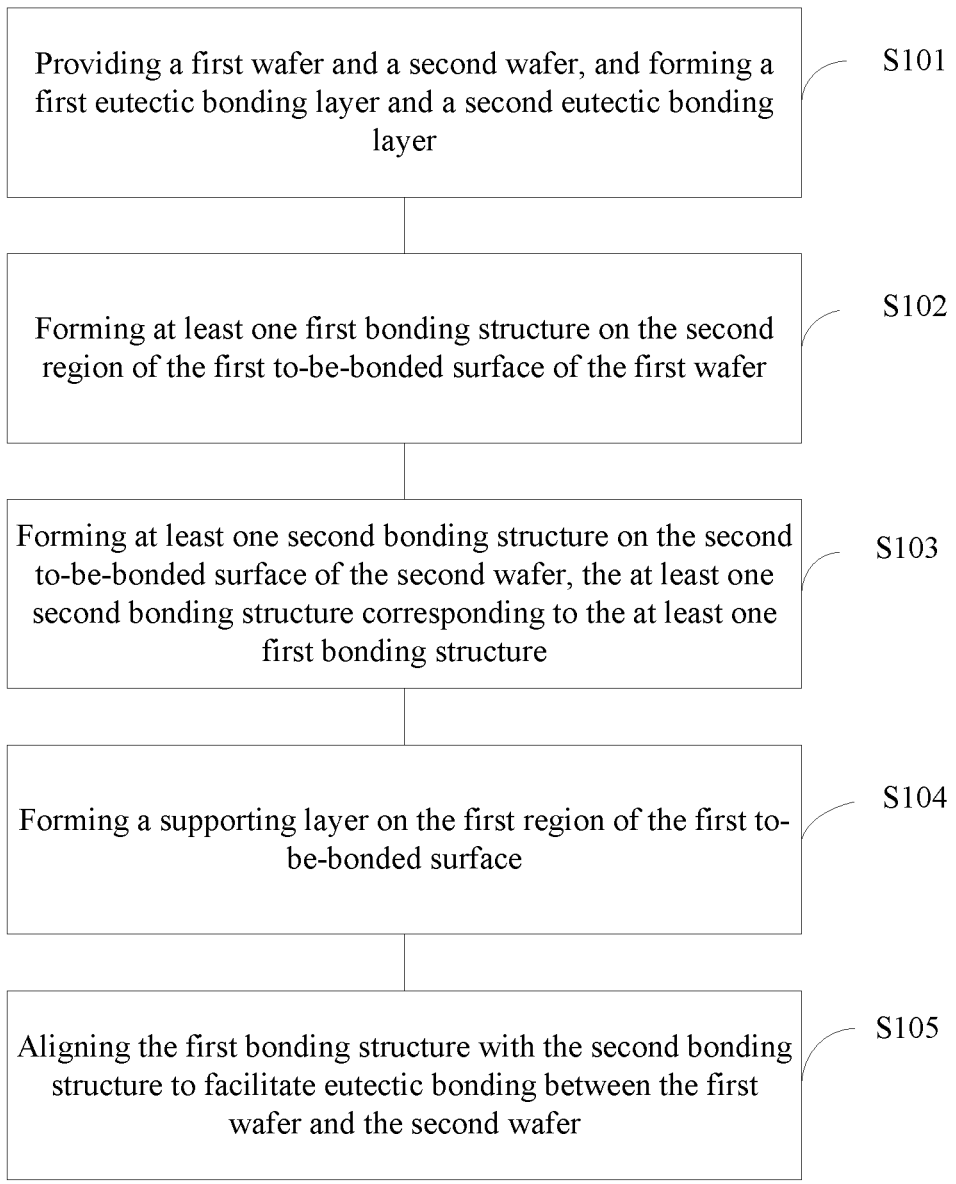
FIG. 9 illustrates a block diagram of an exemplary eutectic bonding process consistent with various disclosed embodiments.

Embodiments of the present disclosure are now described in detail using FIGS. 2-9. FIG. 9 illustrates an exemplary eutectic bonding process. FIGS. 2-7 illustrate the wafer structure at various stages of an exemplary eutectic bonding method.

Figure 1:
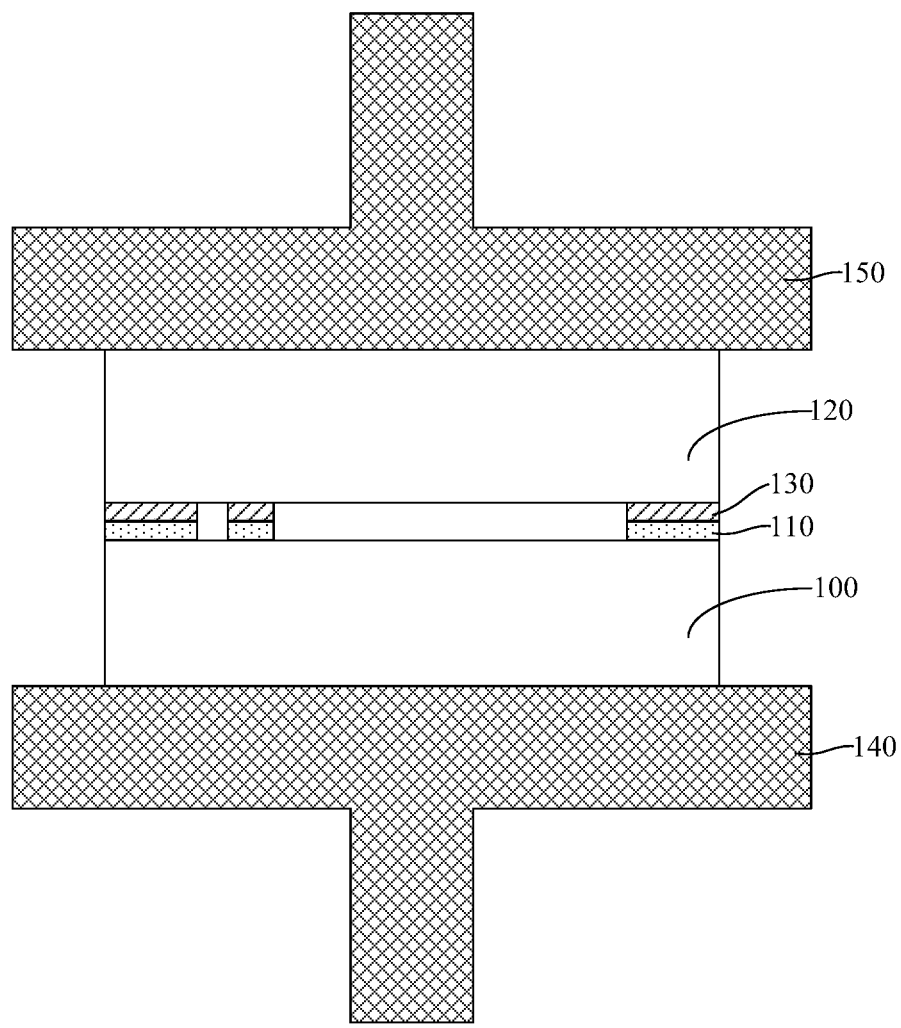
FIG. 1 is a cross-section illustration of a conventional eutectic bonding process.
Figure 2A:
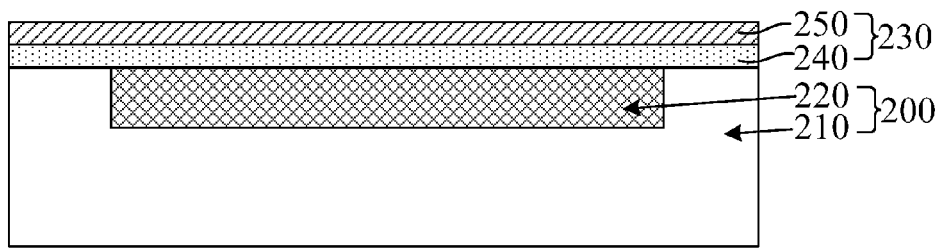
FIGS. 2-7 illustrate the structure of a wafer structure at different stages of an exemplary eutectic bonding process consistent with various disclosed embodiments of the present disclosure.
Figure 2B:
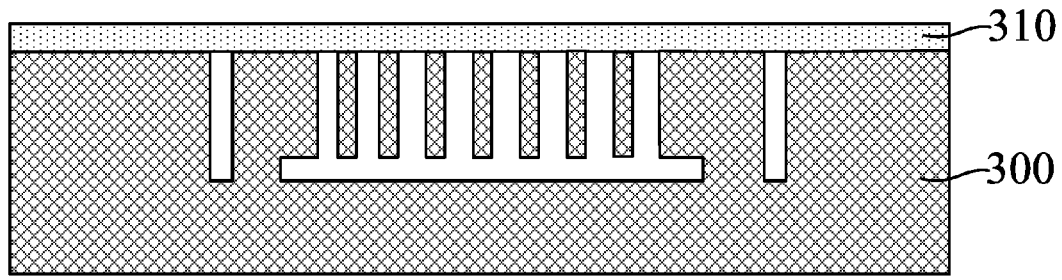

As shown in FIG. 9, at the beginning of the eutectic bonding process, a first substrate and a second substrate are provided (S101). FIGS. 2(a) and 2(b) illustrate corresponding wafer structures.

As shown in FIGS. 2(a) and 2(b), a first wafer 200 and a second wafer 300 may be provided. A first eutectic bonding layer and a second eutectic bonding layer are formed. In one embodiment, the first wafer may be an ASIC wafer, and the second wafer may be a MEMS wafer.

The to-be-bonded surface of the first wafer 200 may be the first to-be-bonded surface. The to-be-bonded surface of the second wafer 300 may be the second to-be-bonded surface. The first wafer 200 may include cutting trenches and functional component units (not shown). The first to-be-bonded surface may include a first region 210 and a second region 220. The first region 210 may correspond to the cutting trenches. The second region 220 may correspond to the functional component units.

A first eutectic bonding layer 230 may be formed on the first to-be-bonded surface. A second eutectic bonding layer 310 may be formed on the second to-be-bonded surface. The first eutectic bonding layer 230 and the second eutectic bonding layer 310 may be formed through any suitable deposition methods/processes, such as electroplating.

The first eutectic bonding layer 230 may be a single-layer structure or a multiple-layer structure. The second eutectic bonding layer 310 may be a single-layer structure. According to actual fabrication requirements and wafer types to be bonded, the first eutectic bonding layer 230 may be a single-layer structure made of Al, and the second eutectic bonding layer 310 may be a Ge layer. Also, the first eutectic bonding layer 230 may be a double-layer structure with an Al layer and a Ge layer, and the second eutectic bonding layer 310 may be an Al layer.

In one embodiment, the first eutectic bonding layer 230 may be a double-layer structure with an Al layer 240 and a Ge layer 250. The second eutectic bonding layer 310 may be an Al layer. The first eutectic bonding layer 230 and the second eutectic bonding layer 310 may be formed through physical vapor deposition.

Figure 3:
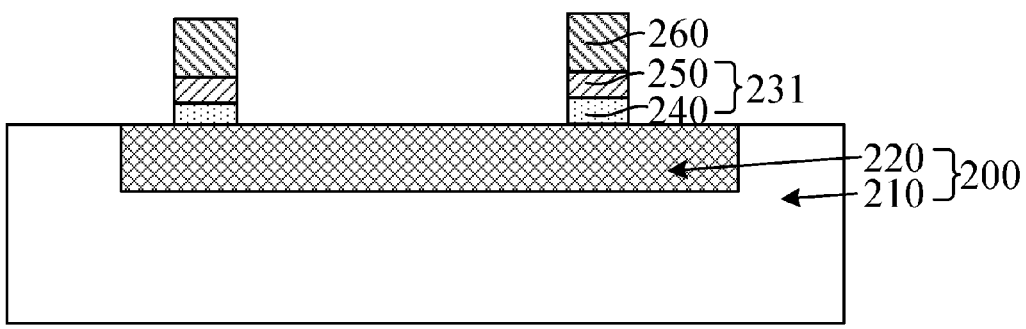

Returning to FIG. 9, after the first eutectic bonding layer and the second eutectic bonding layer are formed, at least one first bonding structure is formed on the second region of the first to-be-bonded surface of the first wafer (S102). FIG. 3 illustrates a corresponding wafer structure.

As shown in FIG. 3, at least one first bonding structure 231 may be formed on the second region 220 of the first to-be-bonded surface of the first wafer 200.

Specifically, in one embodiment, a first patterned mask layer 260 may be formed on the Ge layer 250. The first patterned mask layer 260 may be positioned on the second region 220 of the first wafer 200. The first patterned mask layer 260 may be used as a mask to etch the exposed portions of the Ge layer 250. For example, a plasma dry etching process may be used to sequentially etch the Ge layer and the Al layer until the corresponding portions of the first to-be-bonded surface is exposed. At least one first bonding structure 231 may be formed on the second region 220 of the first wafer 200 using the fabrication process described above. After the first bonding structure 231 is formed, a wet etching process and/or a plasma ashing process may be used to remove the first patterned mask layer 260.

In one embodiment, the first patterned mask layer 260 may be a photoresist layer. The first patterned mask layer 260 may be formed as follows. A photoresist layer may be coated on the Ge layer 250 through a spin-coating process. After exposure and development, the first patterned mask layer 260, exposing portions of the Ge layer 250, may be formed. The first patterned mask layer 260 may be positioned on the second region 220 of the first wafer 200. The patterns, dimensions, and positions of the first patterned mask layer 260 may be the same as the subsequently-formed first bonding structures 231.

In one embodiment, the etchant gas used for the plasma dry etching process may include $Cl_2$, $BCl_3$, Ar, and $N_2$. The etching power of the plasma dry etching process may range from about 200 W to about 900 W. The etching pressure may range from about 7 mTorr to about 200 mTorr. The etching temperature may range from about 40° C. to about 60° C. $Cl_2$ may be the main etchant gas. $BCl_3$ and Ar may mainly be used for perpendicularly bombarding the surfaces of the Ge layer 250 and the Al layer 240 such that anisotropic etching may be obtained. $N_2$ may be used as a passivating gas to protect the sidewalls of the first patterned mask layer 260, the Ge layer 250, and the Al layer 240 from being damaged during the etching process. The formed pattern/structure after the etching process may have desired precision and smoothness.

Figure 4:
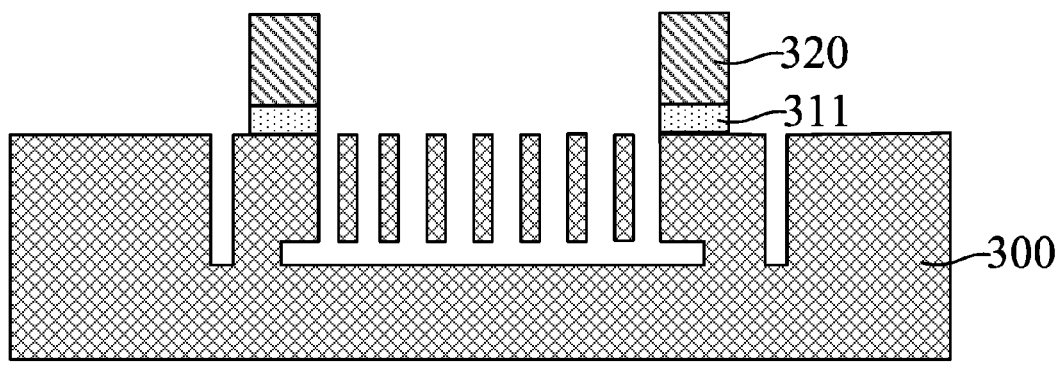

Returning to FIG. 9, after the at least one first bonding structure is formed on the second region of the first to-be-bonded surface of the first wafer, at least one second bonding structure is formed on the second to-be-bonded surface of the second wafer, the at least one second bonding structure corresponding to the at least one first bonding structure (S103). FIG. 4 illustrates a corresponding wafer structure.

As shown in FIG. 4, at least one second bonding structure 311 may be formed on the second to-be-bonded surface of the second wafer 300, the at least one second bonding structure 311 corresponding to the at least one first bonding structure 231.

Specifically, in one embodiment, a second patterned mask layer 320 may be formed on the second eutectic bonding layer 310. The patterns, dimensions, and positions of the second patterned mask layer 320 may be the same as the subsequently-formed second bonding structure 311. The second patterned mask layer 320 may be used as a mask to etch the exposed portions of the second eutectic bonding layer 310. For example, a plasma dry etching process may be used to etch the second eutectic bonding layer 310 until the corresponding portions of the second to-be-bonded surface of the second wafer 300 is exposed. At least one second bonding structure 311 corresponding to the at least one first bonding structure 231 may be formed using the fabrication process described above. After the second bonding structures 311 are formed, a wet etching process and/or a plasma ashing process may be used to remove the second patterned mask layer 320.

In one embodiment, the second patterned mask layer 320 or the mask layer may be a photoresist layer. The second patterned mask layer 320 may be formed as follows. A photoresist layer may be coated on the second eutectic bonding layer 310 through a spin-coating process. After exposure and development, the second patterned mask layer 320, exposing portions of the second eutectic bonding layer 310, may be formed. The patterns, dimensions, and positions of the second patterned mask layer 320 may be the same as the subsequently-formed second bonding structure 311.

In one embodiment, the etchant gas used in the plasma dry etching process may include $Cl_2$, $BCl_3$, Ar, and $N_2$. The etching power of the plasma dry etching process may range from about 200 W to about 400 W. The etching pressure may range from about 30 mTorr to about 200 mTorr. The etching temperature may range from about 40° C. to about 60° C. $Cl_2$ may be the main etchant gas. $Cl_2$ may react with Al to form volatile $AlCl_3$. The $AlCl_3$ may be vented from the reaction chamber by the gas flow. $BCl_3$ and Ar may be mainly used for perpendicularly bombarding the surface of the second eutectic bonding layer 310 such that anisotropic etching may be obtained. $N_2$ may be used as a passivating gas to protect the sidewalls of the second patterned mask layer 320 and the second eutectic bonding layer 310 from being damaged during the etching process. The formed pattern/structure after the etching process may have desired precision and smoothness.

Figure 5:
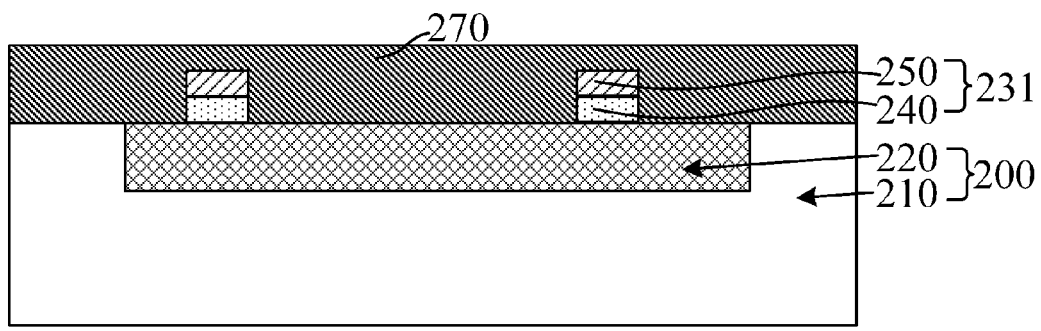
Figure 6:
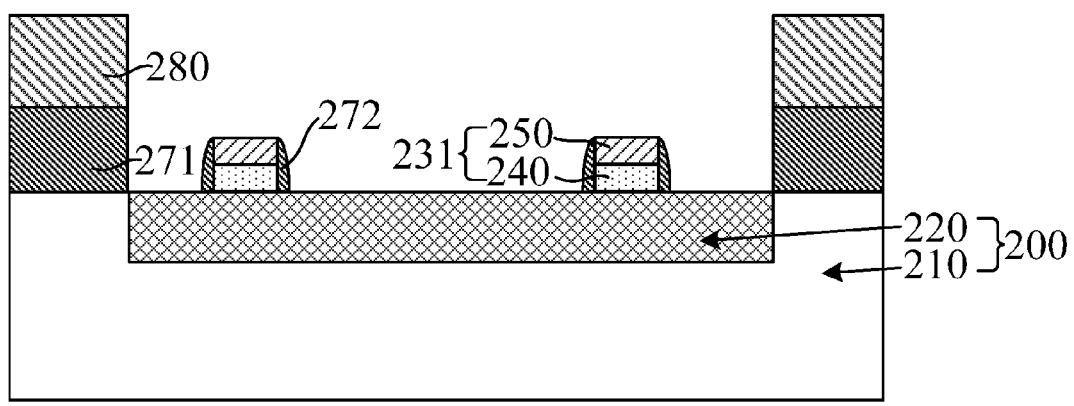

Returning to FIG. 9, after the at least one second bonding structure is formed on the second to-be-bonded surface, a supporting layer is formed on the first region of the first to-be-bonded surface (S104). FIGS. 5 and 6 illustrate the corresponding wafer structures.

As shown in FIGS. 5 and 6, a supporting layer 271 may be formed on the first region 210 of the first to-be-bonded surface of the first wafer 200. The height or thickness of the supporting layer 271 may be greater than the thickness of the first bonding structure 231, and less than a sum of the thicknesses of the first bonding structure 231 and the second bonding structure 311. In one embodiment, a ratio of the thickness of the supporting layer 271 to the sum of the thicknesses of the first bonding structure 231 and the second bonding structure 311 may range between about 0.78 to about 0.9.

When the ratio is less than 0.78, the thickness of the supporting layer 271 may be too small to sustain the pressing force generated by the eutectic bonding process. As a result, the eutectic bonding materials of the first bonding structure 231 and the second bonding structure 311 may overflow outward during the eutectic bonding process. When the ratio is greater than 0.9, the first bonding structure 231 and the second bonding structure 311 may not be able to form contact after being aligned with each other. After the eutectic bonding process, the first bonding structure 231 and the second bonding structure 311 may not be able to fully mix. As a result, the first wafer 200 and/or the second wafer 300 may be susceptible to falling off from each other.

As shown in FIGS. 5 and 6, a process to form the supporting layer 271 may include forming a supporting material layer 270 to cover the first bonding structure 231 and rest of the first to-be-bonded surface. The supporting material layer 270 may be planarized or polished. The planarized supporting material layer 270 may be etched to expose certain portions of the first to-be-bonded surface. Portions of the supporting material layer 270 on the first region 210 of the first to-be-bonded surface may be retained to form the supporting layer 271.

The supporting material layer 270 may be made of a rigid supporting material. In one embodiment, the supporting material layer 270 may be a silicon dioxide layer.

In one embodiment, the silicon dioxide layer, i.e., the supporting material layer 270, may be formed through chemical vapor deposition. Tetraethyl orthosilicate and oxygen may be used as the main sources of reaction to form silicon dioxide. The reaction temperature may range from about 400° C. to about 600° C. The reaction pressure may range from about 0.5 Torr to about 3 Torr. The flow rate of oxygen may range from about 50 sccm to about 1000 sccm.

Specifically, after the supporting material layer 270 is formed to cover the first bonding structure 231 and the rest of the first to-be-bonded surface, a chemical mechanical polishing process may be used to planarize the supporting material layer 270. The height or thickness of the planarized supporting material layer 270 may be higher than the thickness of the first bonding structure 231.

Specifically, a third patterned mask layer 280 may be formed on the supporting material layer 270. The third patterned mask layer 280 may be located on the first region 210 of the first to-be-bonded surface to expose the second region 220 of the first to-be-bonded surface. The third patterned mask layer 280 may be used as the etch mask to etch the portion of the supporting material layer 270 on the second region 220 of the first to-be-bonded region until the second region 220 of the first to-be-bonded surface is exposed. Portions of the supporting material layer 270 on the first region 210 of the first to-be-bonded surface may be retained to form a supporting layer 271. After the supporting layer 271 is formed, a wet etching process and/or a plasma ashing process may be used to remove the third patterned mask layer 280.

In one embodiment, the third patterned mask layer 280 may be a photoresist layer. The third patterned mask layer 280 may be formed as follows. A photoresist layer may be coated on the supporting material layer 270 through a spin-coating process. After exposure and development, the third patterned mask layer 280, exposing the portion of the supporting material layer 270 on the second region 220, may be formed. The third patterned mask layer 280 may be positioned on the first region 210. The patterns, dimensions, and positions of the third patterned mask layer 280 may be the same as the subsequently-formed supporting layer 271.

In the subsequent eutectic bonding process, pressing force generated by the eutectic bonding may be neutralized in the supporting layer 271 so that the eutectic bonding materials disposed between the first wafer 200 and the second wafer 300 would not overflow outward due to excessive pressing force. Short circuits in and/or between the wafers may be avoided.

It should be noted that, in the process of etching the supporting material layer 270, portions of the supporting material layer on two sides of a first bonding structure 231 may be retained to form a shoulder supporting layer 272 or a side supporting layer 272. The shoulder supporting layer 272 may also be used to sustain the pressing force during the subsequent eutectic bonding process. The shoulder supporting layer 272 may protect the eutectic bonding materials and prevent the eutectic bonding materials from overflowing outward.

In one embodiment, a plasma dry etching process may be used to etch the supporting material layer 270. Fluorine-containing gas mixed with He may be used as the main etchant gas. The fluorine-containing gas used in the plasma dry etching process may include one or more of $Cl_4$, $CHF_3$, $CH_2F_2$, and $CH_3F$. The gas flow rate may range from about 50 sccm to about 150 sccm. The bias for the dry etching process may range from about 200 V to about 300 V. The etching pressure may range from about 1 mTorr to about 10 mTorr. The etching temperature may range from about 10° C. to about 100° C. The etching power may range from about 200 W to about 500 W.

Returning to FIG. 9, after the supporting layer is formed, the first bonding structure and the second bonding structure are aligned with each other to facilitate eutectic bonding between the first wafer and the second wafer (S105). FIG. 7 illustrates a corresponding wafer structure.

As shown in FIG. 7, the first bonding structure 231 and the second bonding structure 311 may be aligned with each other to facilitate eutectic bonding between the first wafer 200 and the second wafer 300.

In one embodiment, the eutectic bonding process may include several steps, described as follows. The first wafer 200 may be placed on the first hot plate 400 and the second wafer 300 may be place on the second hot plate 410, such that the first bonding structure 231 and the second bonding structure 311 may be facing and contacting each other. The first hot plate 400 and the second hot plate 410 may be heated up to the eutectic temperature. Under the eutectic temperature, pressing forces may be applied on the first hot plate 400 and the second hot plate 410 at the same time. The first bonding structure 231 and the second bonding structure 311 may melt and mix to form an alloy under the pressing forces and the heat. Thus, eutectic bonding may be formed between the first wafer 200 and the second wafer 300.

In the eutectic bonding process, pressing force generated by the eutectic bonding may be neutralized in the supporting layer 271 so that the first bonding structure 231 and the second bonding structure 311 may be protected. Meanwhile, the eutectic bonding materials of the first bonding structure 231 and the second bonding structure 311 may be prevented from overflowing outward. Short circuits may be avoided or reduced in and/or between wafers. In addition, the shoulder supporting layer 272 may also sustain some of the pressing force during the eutectic bonding process to protect the first bonding structure 231 and the second bonding structure 311. The shoulder supporting layer 272 may also prevent the eutectic bonding materials of the first bonding structure 231 and the second bonding structure 311 from overflowing outward.

When the eutectic temperature is too low, and/or the pressing forces applied on the first hot plate 400 and the second hot plate 410 are too low, the eutectic bonding materials of the first hot plate 400 and the second hot plate 410 may not reach the desired eutectic temperature and/or the pressing force applied on the first hot plate 400 and the second hot plate 410 may not be sufficient under the desired eutectic temperature. In these cases, the alloy formed by the first bonding structure 231 and the second bonding structure 311 may have impaired quality, which may further cause the first wafer 200 and the second wafer 300 to be susceptible to falling off from each other after the eutectic bonding process.

When the eutectic temperature is too high, and/or the pressing forces applied on the first hot plate 400 and the second hot plate 410 are too high, the supporting layer 271 may be deformed or may deteriorate. The ability of the supporting layer 271 to sustain the pressing force generated by the eutectic bonding process may be adversely affected. As a result, the eutectic bonding materials of the first bonding structure 231 and the second bonding structure 311 may overflow outward due to excessive pressing force. In one embodiment, the eutectic temperature may range from about 420 K to about 435 K. The pressing forces applied on the first hot plate 400 and the second hot plate 410 may range from about 10 KN to about 50 KN.

Based on the eutectic temperature and the pressing forces applied on the first hot plate 400 and the second hot plate 410, when the processing time of the eutectic bonding process is too short, the eutectic bonding materials of the first bonding structure 231 and the second bonding structure 311 may not melt and mix completely to form a desired alloy. The incomplete melting and/or mixing may also cause the alloy, formed by the first bonding structure 231 and the second bonding structure 311, to have impaired quality. As a result, the first wafer 200 and the second wafer 300 may be susceptible to falling off from each other after the eutectic bonding process.

When the processing time of the eutectic bonding process is too long, the eutectic bonding materials of the first bonding structure 231 and the second bonding structure 311 may already melt and mix completely to form an alloy. Further addition of processing time would not contribute to the alloying of the eutectic bonding materials. As a result, processing resources may be wasted and efficiency of the eutectic bonding process may be reduced. Exposing the first wafer 200 and the second wafer 300 under the processing temperature for too long may also cause the supporting layer 271 to deform or deteriorate. The eutectic bonging material may overflow outward during the eutectic bonding process due to excessive pressing force. Thus, in one embodiment, under the eutectic temperature and pressing forces provided for the eutectic bonding process, the processing time of the eutectic bonding process may range from about 10 minutes to about 30 minutes.

After the eutectic bonding process between the first wafer 200 and the second wafer 300 is completed, a thinning process may be performed on the back surfaces of the wafers. The back surfaces may refer to the surfaces, of the first wafer 200 and the second wafer 300, that are facing away from the eutectic bonding materials/alloy. Other related processes, e.g., Al/Cu rewiring process, and ball drop process, may also be performed to form a wafer-level bonding packaging structure.

Another aspect of the present disclosure provides a wafer structure. The wafer structure is formed by a eutectic bonding process. FIG. 8 illustrates an exemplary wafer structure formed by the disclosed eutectic bonding process. The wafer structure may include a first wafer 200, a second wafer 300, at least one first bonding structure 231, at least one second bonding structure 311, and a supporting layer 271.

The surface that is to be bonded, of the first wafer 200, may be the first to-be-bonded surface. The first wafer 200 may include cutting trenches and functional component units. The first to-be-bonded surface may include a first region 210 and a second region 220. The first region 210 may correspond to the cutting trenches. The second region 220 may correspond to the functional component units.

The second wafer 300 may be aligned with the first wafer 200 and bonded with the first wafer 300. The surface that is to be bonded, of the second wafer 300, may be the second to-be-bonded surface.

The at least one first structure 231 may be positioned on the second region 220 of the first wafer 200.

The at least one second bonding structure 311 may be positioned on the second to-be-bonded surface of the second wafer 300. The second bonding structure 311 may correspond to the first bonding structure 231. The second bonding structure 311 may be bonded with the first bonding structure 231 through eutectic bonding.

The supporting layer 271 may be positioned on the first region 210 of the first to-be-bonded surface and be between the first wafer 200 and the second wafer 300. One surface of the supporting layer 271 may contact the first to-be-bonded surface, and the other surface of the supporting layer 271 may contact the second to-be-bonded surface.

In the eutectic bonding process, the pressing force generated by the eutectic bonding may be neutralized in the supporting layer 271 such that the eutectic bonding materials of the first wafer 200 and the second wafer 300 would not overflow outward because of the excessive pressing force. Short circuits in and/or between the wafers may be avoided or reduced.

In one embodiment, the first bonding structure 231 may be a single-layer structure or multiple-layer structure. The second bonding structure 311 may be a single-layer structure.

When the first bonding structure 231 is a single-layer structure made of Al, the second bonding structure 311 may be a Ge layer. When the first bonding structure 231 is a double-layer structure with an Al layer and a Ge layer, the second bonding structure 311 may be an Al layer.

It should be noted that, in one embodiment, the disclosed wafer structure may also include a shoulder supporting layer 272. The shoulder supporting layer 272 may include a plurality of shoulder supporting portions. Two shoulder supporting portion may be disposed on two sides of a first bonding structure 231.

The shoulder supporting layer 272 may also sustain some of the pressing force during the eutectic bonding process to protect the eutectic bonding materials and prevent the eutectic bonding materials from overflowing outward at the same time.

It should be noted that, the present disclosure utilizes the eutectic bonding between an ASIC wafer and an MEMS wafer as an example to illustrate the embodiments. However, the types and the number of wafers used in the eutectic bonding process should not be limited by the embodiments of the present disclosure. In other embodiments, the bonding method and wafer structure may also be applied on other combinations of wafers such as between ASIC wafers and between MEMS wafers. Other numbers of wafers may also be bonded using the disclosed bonding method and wafer structure. For example, a first wafer may include two first to-be-bonded surfaces to form eutectic bonding with two second wafers, and vice versa.

In the present disclosure, the terms "first", "second", "third", and the alike are only used for illustrative purposes to distinguish different parts and/or processes. The use of these terms do not indicate any differences in composition, function, and the formation order of the related parts/processes. For example, "a first wafer" and a second wafer" do not indicate different types of wafers. A "first" wafer and a "second" wafer may be the same type of wafers or may be different types of wafers.

Compared to a conventional eutectic bonding process, the disclosed bonding method and wafer structure may have several advantages. According to the disclosed eutectic bonding method, a supporting layer is formed on the first region of the first to-be-bonded surface. During the eutectic bonding process that the first wafer and the second wafer are bonded together, pressing force generated by the eutectic bonding may be neutralized in the supporting layer so that the eutectic bonding materials between the first wafer and the second wafer would not overflow outward due to excessive pressing force. Short circuits in and/or between the wafers may be avoided or reduced. In addition, the disclosed wafer structure may also include a shoulder supporting layer. The shoulder supporting layer may include a plurality of shoulder supporting portions. Two shoulder supporting portions may be disposed on two sides of a first bonding structure. The shoulder supporting layer may also sustain some of the pressing force during the eutectic bonding process to protect the eutectic bonding materials and prevent the eutectic bonding materials from overflowing outward at the same time.

Other embodiments of the disclosure will be apparent to those skilled in the art from consideration of the specification and practice of the invention disclosed herein. It is intended that the specification and examples be considered as exemplary only, with a true scope and spirit of the invention being indicated by the claims.

What is claimed is:

1. A wafer-level bonding packaging method, comprising:
    providing a plurality of first wafers and a plurality of second wafers, a to-be-bonded surface of a first wafer being a first to-be-bonded surface, a to-be-bonded surface of a second wafer being a second to-be-bonded surface, and the first to-be-bonded surface including a first region and a second region;
    forming at least one first bonding structure on the second region;

forming at least one second bonding structure on a second to-be-bonded surface, the at least one second bonding structure corresponding to the at least one first bonding structure;

forming a supporting layer on the first region, a height of supporting layer being greater than a height of the first bonding structure and less than a sum of the height of the first bonding structure and a height of the second bonding structure, a bottom surface of the supporting layer being coplanar with a bottom surface of the at least one first bonding structure; and aligning at least one first bonding structure with at least one second bonding structure to facilitate eutectic bonding between at least one first wafer and at least one second wafer.

2. A wafer-level bonding packaging method, comprising:

providing a plurality of first wafers and a plurality of second wafers, a to-be-bonded surface of a first wafer being a first to-be-bonded surface, a to-be-bonded surface of a second wafer being a second to-be-bonded surface, and the first to-be-bonded surface including a first region and a second region;

forming at least one first bonding structure on the second region;

forming at least one second bonding structure on a second to-be-bonded surface, the at least one second bonding structure corresponding to the at least one first bonding structure;

forming a supporting layer on the first region, a height of supporting layer being greater than a height of the first bonding structure and less than a sum of the height of the first bonding structure and a height of the second bonding structure; and aligning at least one first bonding structure with at least one second bonding structure to facilitate eutectic bonding between at least one first wafer and at least one second wafer;

wherein forming the supporting layer includes:
  forming a supporting material layer to cover the first bonding structure and a rest of the first to-be-bonded surface;
  planarizing the supporting material layer;
  forming a patterned mask on a planarized supporting material layer, the patterned mask layer covering the first region of the first to-be-bonded surface and exposing the second region of the second to-be-bonded surface; and
  using the patterned mask as an etch mask to etch an exposed portion of the supporting material layer on the second region until the first to-be-bonded surface is exposed, portions of the supporting material layer on the first region being retained.

3. The packaging method according to claim 2, wherein a chemical mechanical polishing process is applied on the supporting material layer for planarizing the supporting material layer.

4. The packaging method according to claim 2, wherein a chemical vapor deposition process is used to form the supporting material layer.

5. The packaging method according to claim 2, wherein a plasma dry etching process is used to etch the supporting material layer.

6. The packaging method according to claim 2, wherein during the process to etch the supporting material layer, portions of the supporting material layer are retained on two sides of a first bonding structure to form a shoulder supporting layer for neutralizing some pressing force generating by the eutectic bonding.

7. The packaging method according to claim 2, wherein a ratio of the thickness of the supporting layer to sum of the thickness of the first bonding structure and the thickness of the second bonding structure ranges between about 0.78 to about 0.9.

8. The packaging method according to claim 1, wherein a first wafer includes trenches and functional component units, the first region of the first wafer corresponding to the functional component units and the second region of the first wafer corresponding to trenches.

9. The packaging method according to claim 1, wherein a process to form the eutectic bonding includes:
  placing a first wafer on a first hot plate and placing a second wafer on a second hot plate;
  aligning the first bonding structure with the second bonding structure so that the first bonding structure is facing and contacting the second bonding structure;
  heating up the first hot plate and the second hot plate to reach a eutectic temperature; and
  at the eutectic temperature, pressing the first hot plate and the second hot plate simultaneously such that the eutectic bonding is formed between the first wafer and the second wafer.

10. The packaging method according to claim 1, wherein the first bonding structure is a single-layer structure or a multiple-layer structure, and the second bonding structure is a single-layer structure.

11. The packaging method according to claim 10, wherein the first bonding structure is a single-layer structure made of Al, and the second bonding structure is made of Ge.

12. The packaging method according to claim 10, wherein the first bonding structure is a double-layer structure with an Al layer and a Ge layer, and the second bonding structure is made of Al.

13. The packaging method according to claim 2, wherein the supporting material layer is made of a rigid material.

14. A wafer structure formed by eutectic bonding, comprising a plurality of first wafers, a plurality of second wafers, at least one supporting layer, a plurality of first bonding structures, and a plurality of second bonding structures, wherein:
  a first wafer has at least one first to-be-bonded surface for forming eutectic bonding, a first to-be-bonded surface including a first region and a second region, and at least one first bonding structures being formed on the second region;
  a second wafer has at least one second to-be-bonded surface for forming eutectic bonding, at least one second bonding structures being formed at the second to-be-bonded surface, a second bonding structure corresponding to a first bonding structure and forming eutectic bonding with the first bonding structure; and
  a supporting layer is disposed on the first region of a first to-be-bonded surface between a first wafer and a second wafer, one surface of the supporting layer contacting the first to-be-bonded surface and another surface of the supporting layer contacting a second to-be-bonded surface, and a bottom surface of the supporting layer is coplanar with a bottom surface of the at least one first bonding structure.

15. The wafer structure according to claim 14, wherein a first wafer includes trenches and functional component units, the first region of the first wafer corresponding to the functional component units and the second region of the first wafer corresponding to trenches.

16. The wafer structure according to claim 14, further including a shoulder supporting layer with a plurality of shoulder supporting portions, two shoulder supporting portions being formed at two sides of a first bonding structure.

17. The wafer structure according to claim 14, wherein the first bonding structure is a single-layer structure or a multiple-layer structure, and the second bonding structure is a single-layer structure.

18. The wafer structure according to claim 17, wherein the first bonding structure is a single-layer structure made of Al, and the second bonding structure is made of Ge.

19. The wafer structure according to claim 17, wherein the first bonding structure is a double-layer structure with an Al layer and a Ge layer, and the second bonding structure is made of Al.

20. The wafer structure according to claim 14, wherein the supporting layer is made of a rigid material.

* * * * *